United States Patent
Isler

(10) Patent No.: US 10,330,741 B2
(45) Date of Patent: Jun. 25, 2019

(54) MAGNETIC FIELD SENSOR WITH COIL STRUCTURE AND METHOD OF FABRICATION

(71) Applicant: NXP B.V., Eindhoven (NL)

(72) Inventor: Mark Isler, Hamburg (DE)

(73) Assignee: NXP B.V., Eindhoven (NL)

( * ) Notice: Subject to any disclaimer, the term of this patent is extended or adjusted under 35 U.S.C. 154(b) by 144 days.

(21) Appl. No.: 15/719,932

(22) Filed: Sep. 29, 2017

(65) Prior Publication Data
US 2019/0101600 A1  Apr. 4, 2019

(51) Int. Cl.
  G01R 33/00 (2006.01)
  G01R 33/09 (2006.01)

(52) U.S. Cl.
  CPC ..... G01R 33/0017 (2013.01); G01R 33/0052 (2013.01); G01R 33/09 (2013.01); G01R 33/096 (2013.01); G01R 33/098 (2013.01)

(58) Field of Classification Search
  CPC ........ G01N 27/72; G01N 27/82; G01R 33/00; G01R 33/0035; G01R 33/0047; G01R 33/0322; G01R 33/0327; G01R 33/10; G01R 33/1284; G01R 33/0206; G01R 33/028; G01R 33/038; G01R 33/1215
  See application file for complete search history.

(56) References Cited

U.S. PATENT DOCUMENTS

| | | |
|---|---|---|
| 5,583,436 A | 12/1996 | Van De Walle et al. |
| 5,796,249 A | 8/1998 | Andra et al. |
| 6,008,102 A | 12/1999 | Alford et al. |
| 10,228,426 B2 * | 3/2019 | Deak .................. G01R 33/09 |
| 2007/0200564 A1 | 8/2007 | Motz et al. |
| 2008/0054896 A1 | 3/2008 | Kahlman |
| 2014/0300348 A1 | 10/2014 | Deak et al. |
| 2016/0202329 A1 | 7/2016 | Paci |
| 2017/0115363 A1 | 4/2017 | Jiang et al. |
| 2018/0081000 A1 | 3/2018 | Deak et al. |
| 2018/0335485 A1 * | 11/2018 | Masuda ............... G01R 33/093 |

FOREIGN PATENT DOCUMENTS

| | | |
|---|---|---|
| DE | 102007044485 A1 | 4/2009 |
| EP | 2908150 A1 | 8/2015 |
| WO | WO-2016/110244 A1 | 7/2016 |

* cited by examiner

*Primary Examiner* — Tung X Nguyen
(74) *Attorney, Agent, or Firm* — Charlene R. Jacobsen

(57) ABSTRACT

A method includes forming first coil segments in an electrically conductive layer of an active silicon substrate, forming a magnetic sense element over an electrically insulating layer of the active silicon substrate, the magnetic sense element being separated from the first coil segments in the electrically conductive layer by the electrically insulating layer. A protective layer is formed over the magnetic sense element. Conductive vias are formed extending through the protective layer and the electrically insulating layer to electrically couple with the first coil segments, and second coil segments are formed over the protective layer, the second coil segments electrically coupling with the conductive vias to produce a coil structure of the first coil segments, the conductive vias, and the second coil segments, with the coil structure surrounding the magnetic sense element.

20 Claims, 11 Drawing Sheets

MAGNETIC FIELD SENSOR WITH COIL STRUCTURE AND METHOD OF FABRICATION

TECHNICAL FIELD OF THE INVENTION

The present invention relates generally to magnetic field sensors. More specifically, the present invention relates to a three-dimensional coil structure surrounding a magnetic sense element of a magnetic field sensor and fabrication methodology.

BACKGROUND OF THE INVENTION

Magnetic field sensor systems are utilized in a variety of commercial, industrial, and automotive applications to measure magnetic fields for purposes of speed and direction sensing, angular sensing, proximity sensing, and the like. Magnetic field sensors may be based on semiconductor materials (e.g., Hall sensors, magnetoresistors, and so forth) and ferromagnetic materials (e.g., ferromagnetic magnetoresistors and flux guides). Other magnetic field sensors may utilize optical, resonant, and superconducting properties.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns magnetic field sensors and methodology for fabricating magnetic field sensors. More particularly, the fabrication methodology yields a magnetic field sensor having one or more magnetic sense elements encompassed by a three-dimensional coil structure. The magnetic sense elements and coil structure may be formed on an active silicon substrate that contains an integrated circuit for sensor signal processing and control circuitry for the coil structure. Such a three-dimensional coil structure may replace commonly used and costly bias magnets for speed sensing with the benefit of improved linearity and temperature behavior. Further, a three-dimensional coil structure may enable superior applied magnetic field strength to power consumption ratio as compared to a planar coil structure. Thus, on-chip signal modulation techniques, bias field flipping, feedback compensation, and magnetic sense element self-test may be feasible. The fabrication methodology may achieve a robust, cost optimized, and high yield process that enables relatively low cost integration of the integrated circuit, the magnetic field sensor, and the three-dimensional coil structure. Further, a variety of three-dimensional coil structure designs may be envisioned that may achieve further savings in the form of relatively low area consumption.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
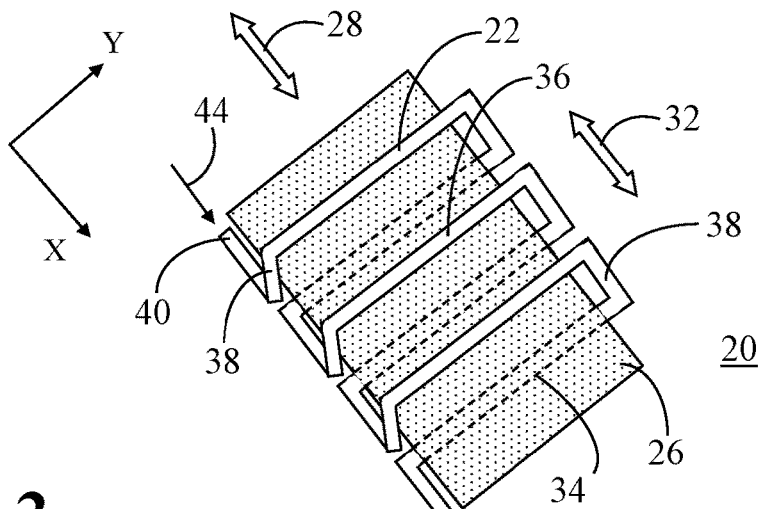
FIG. 1 shows in a simplified and representative form a perspective view of a magnetic field sensor having an integrated three-dimensional coil structure.
Figure 2:
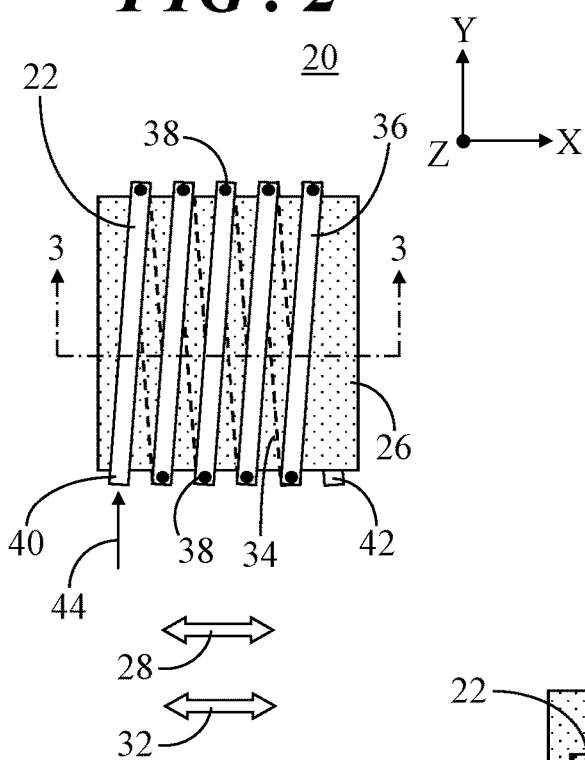
FIG. 2 shows a plan view of magnetic field sensor with the coil structure.
Figure 3:
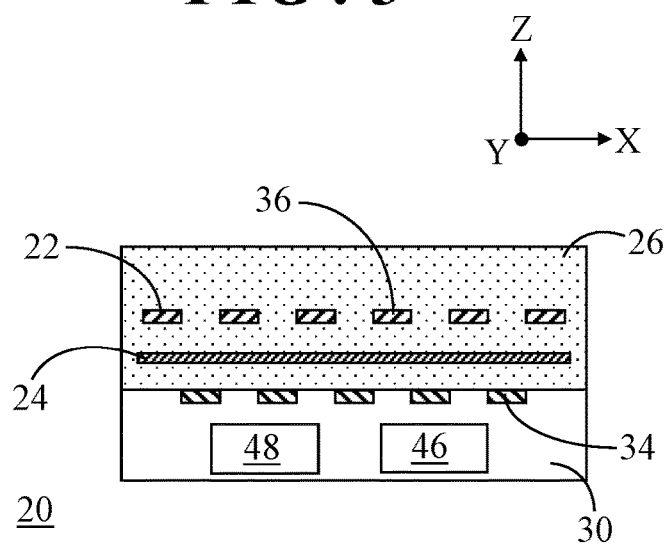
FIG. 3 shows a side sectional view of the magnetic field sensor along section lines 3-3 of FIG. 2.

Referring to FIGS. 1-3, FIG. 1 shows in a simplified and representative form a perspective view of a magnetic field sensor 20 having an integrated three-dimensional coil structure 22. FIG. 2 shows a plan view of magnetic field sensor 20 with coil structure 22, and FIG. 3 shows a side sectional view of magnetic field sensor 20 along section line 3-3 of FIG. 2. In FIG. 1, a magnetic sense element 24 (visible in FIG. 3) is embedded within one or more passivation layers 26. Thus, magnetic sense element 24 is hidden from view in FIG. 1. However, in the side sectional view of FIG. 3, magnetic sense element 24 is visible with coil segments of coil structure 22 on opposing sides of magnetic sense element 24. However, coil structure 22 may additionally be embedded in passivation layers 26 as shown in FIG. 3.

Magnetic sense element 24 represents one or multiple magnetoresistance sense elements such as anisotropic magnetoresistance (AMR) sense elements, tunnel magnetoresistance (TMR) sense elements, giant magnetoresistance (GMR) sense elements, or any other magneto resistors capable of detecting an external magnetic field 28, represented by a thick bi-directional arrow. Further, the one or multiple magnetoresistance sense elements may be arranged as single elements, or in half or full bridge configurations to form a sensor element integrated in an active silicon substrate 30.

In general, coil structure 22 is a magnetic field source for providing an internal magnetic field 32, represented by another bi-directional arrow, that is generally oriented in the same direction as external magnetic field 26 in this example. Coil structure 22 may include electrically conductive, e.g., metallic, coil segments proximate magnetic sense element 24. In the simplified illustrated example, coil structure 22 may include first coil segments 34 that are located directly below magnetic sense element 24 and second coil segments 36 that are located directly above magnetic sense element 24. First and second coil segments 34, 36 are connected with vias 38 at their endpoints to form coil structure 22. In FIGS. 1 and 2, first coil segments 34 are hidden from view by magnetic sense element 24, and are thus represented by dashed lines.

Connection terminals to coil structure 22 may include a first terminal 40 and a second terminal 42. Coil structure 22 may be arranged such that a coil current 44 flows through coil structure 22 from first terminal 40 to second terminal 42. Coil current 44 may be continuous or pulsed. When coil structure 22 is energized, coil current 44 flows through coil structure 22 and generates internal magnetic field 32 along the winding direction of coil structure 22. Thus, a known and adjustable magnetic effect may be produced within the region of magnetic sense element 24 and may be detectable by magnetic sense element 24. The orientation of the coil winding of coil structure 22 relative to magnetic sense element 24 may be parallel, perpendicular, forty-five degrees, or any angle between the former mentioned orientations. Accordingly, coil structure 22 generally represents a wide variety of coil designs that may be optimized to achieve low area consumption.

In general, active silicon substrate 30 represents semiconductor chip having implemented therein an integrated circuit 46 for sensor signal processing and control circuitry 48 for coil structure 22. Integrated circuit 46 and control circuitry 48 are represented by simple blocks within active silicon substrate 30. However, those skilled in the art will recognize that integrated circuit 46 and control circuitry 48 can encompass a wide variety of processing, control, or other structures. Therefore, in the interest of brevity and minimization of any risk of obscuring the principles and concepts of the various embodiments, further discussion of such structures, if any, will be limited to the essentials with respect to the principles and concepts of the various embodiments. Methodology disclosed herein enables the integration of magnetic sense element 24 and three-dimensional coil structure 22 on active silicon substrate 30 to yield cost and manufacturing optimization, as well as robust and low area consumption three-dimensional coil structures.

Figure 4:
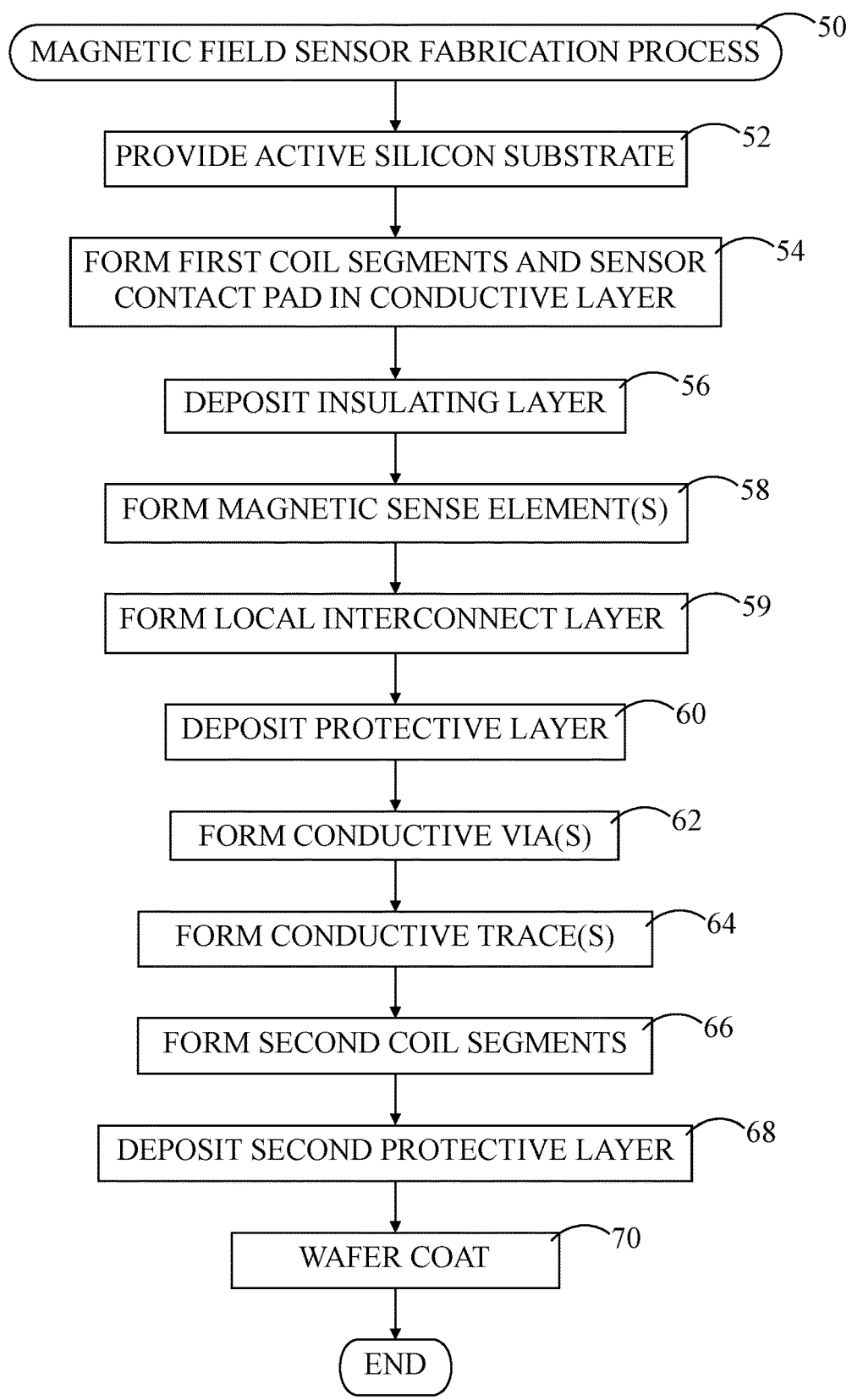
FIG. 4 shows flowchart of a magnetic field sensor fabrication process in accordance with an embodiment.

Referring now to FIG. 4, FIG. 4 shows flowchart of a magnetic field sensor fabrication process 50 in accordance with an embodiment. Magnetic field sensor fabrication process 50 summarizes operations that may be performed to integrate a magnetic sense element (e.g., magnetic sense element 24) and a three-dimensional coil structure (e.g., coil structure 22) on an active silicon substrate (e.g., active silicon substrate 30). The subsequent FIGS. 5-23 demonstrate the various operations summarized in magnetic field sensor fabrication process 50. Magnetic field sensor fabrication process 50 will be described in connection with the fabrication of magnetic field sensor 20. Hence, reference should be made concurrently with FIGS. 1-3 along with the discussion of magnetic field sensor fabrication process 50 of FIG. 4.

At a block 52, active silicon substrate 30 is provided. By way of example, integrated circuit 46 and control circuitry 48 of active silicon substrate 30 may be fabricated in accordance with a complementary metal-oxide-semiconductor (CMOS) front end process and at least a portion of a CMOS back end process. At a block 54, structures are formed in a top metal layer (i.e., an electrically conductive layer) of the active silicon substrate. This top metal layer is sometimes referred to as a "metal N" layer. The structures associated with magnetic field sensor 20 may include first coil segments 34 and one or more sensor contact pads (discussed below). Of course, other structures may also be formed in the top metal layer in accordance with the particular design of active silicon substrate 30. Further, although a CMOS technology is mentioned herein, other suitable processes for implementing circuitry on integrated circuits (chips) may alternatively be used.

At a block 56, one or more electrically insulating layers may be deposited over the first coil segments 34 and sensor contact pads of the top metal layer. At a block 58, magnetic sense element(s) 24 are formed over the electrically insulating layer of active silicon substrate 30 such that magnetic sense element(s) 24 is separated from first coil segments 34 by the electrically insulating layer. At a block 59, a local interconnect layer may be formed for the magnetic sense elements. At a block 60, a protective layer is formed over magnetic sense element(s) 24. The protective layer, which may be a passivation layer, may additionally be deposited over any exposed portions of the electrically insulating layer.

At a block 62, electrically conductive vias 38 (referred to herein as first conductive vias 38) are formed extending through the protective layer and the electrically insulating layer of active silicon substrate 30. First conductive vias 38 are electrically coupled with first coil segments 34. In addition, one or more additional vias (referred to herein as second conductive vias and discussed below) may be formed extending through the protective layer to electrically couple with one or more contact pads of the magnetic sense element(s) 24. Further, one or more additional vias (referred to herein as third conductive vias and discussed below) may be formed extending through the protective layer and electrically insulating layer to electrically couple with one or more sensor contact pads formed in the top metal layer at block 54.

At a block 64, one or more electrically conductive traces (discussed below) may be formed extending between and suitably electrically interconnecting the second and third conductive vias. At a block 66, second coil segments 36 are formed over the protective layer and are electrically coupled with first conductive vias 38. Thus, coil structure 22 of first coil segments 34, conductive vias 38, and second coil segments 36 is produced. In some embodiments, all of the conductive vias, the second coil segments, and the conductive traces may be formed concurrently using an electrically conductive material layer deposition, patterning, and etching, operations. In other embodiments, all of the conductive vias may be formed concurrently as a single processing module while second coil segments 36 and the conductive traces are formed in a processing module that is separate from (i.e., serial to) formation of the conductive vias.

At a block 68, another protective layer (e.g., passivation) may be deposited over the conductive vias, the second coil segments, and the conductive traces, and at a block 70, wafer coating or spin coating may be performed to deposit an insulating material over the entire surface of the structure (e.g., over the protective passivation layer) to yield a wafer-level chip package having a generally uniform surface. Thereafter, openings may be made through the various layers to access one or more bond pads in the top metal layer of the active silicon substrate 30. These bond pads may be used to electrically interconnect magnetic field sensor 20 with external components. Other subsequent operations may entail testing after completion of manufacturing on the wafer, and cutting, dicing, or otherwise separating the wafer into single chip packages. Thereafter, magnetic field sensor fabrication process 50 ends.

It is to be understood that certain ones of the process blocks depicted in FIG. 4 may be performed in parallel with each other or with performing other processes. In addition, it is to be understood that the particular ordering of the process blocks depicted in FIG. 4 may be modified, while achieving substantially the same result. Accordingly, such modifications are intended to be included within the scope of the inventive subject matter.

FIGS. 5-11 demonstrate the operations of magnetic field sensor fabrication process 50 for an AMR-based magnetic field sensor configuration in accordance with an embodiment. FIGS. 12-15 demonstrate the operations of magnetic field sensor fabrication process 50 for an AMR-based magnetic field sensor configuration in accordance with another embodiment. FIGS. 16-23 demonstrate the operations of magnetic field sensor fabrication process 50 for a TMR-based magnetic field sensor configuration in accordance with another embodiment. Thus, magnetic field sensor fabrication process 50 should be referred to in conjunction with the following discussion of FIGS. 5-23.

Figure 5:
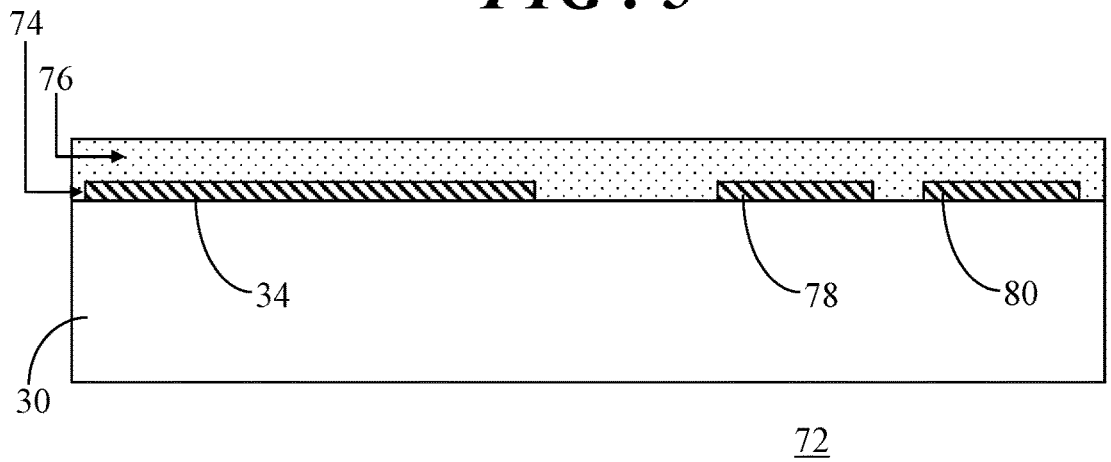
FIG. 5 shows a simplified side sectional view of a structure at an initial stage of processing in accordance with an embodiment.

FIG. 5 shows a simplified side sectional view of a structure at an initial stage 72 of processing in accordance with an embodiment. At initial stage 72, active silicon substrate 30 has been provided in accordance with block 52 of fabrication process 50, structures have been formed in a top metal layer 74 (alternatively referred to as a first electrically conductive layer 74) of active silicon substrate 30 in accordance with block 54 of fabrication process 50, and an insulating layer 76 has been deposited over conductive layer 74 in accordance with block 56 of fabrication process 50. In an example, first coil segments 34 (one coil segment shown), one or more sensor electrical contact pads 78 (one shown), and one or more bond pads 80 (one shown) are formed in electrically conductive layer 74.

Sensor electrical contact pads 78 are electrically coupled to a processing circuit (e.g., integrated circuit 46 of FIG. 3) in active silicon substrate 78. Bond pads 80 may be utilized for electrical connection of integrated circuit 46 and/or control circuit 48 (FIG. 3) of active silicon substrate to components and structures external to magnetic field sensor 20. Insulating layer 76 may be, for example, one or more layers of an oxide material in which first coil segments 34, sensor contact pads 78, and bond pads 80 are buried. Insulating layer 76 may undergo chemical-mechanical planarization (CMP) in order to provide a flat, smooth outer surface of insulating layer 76.

Figure 6:
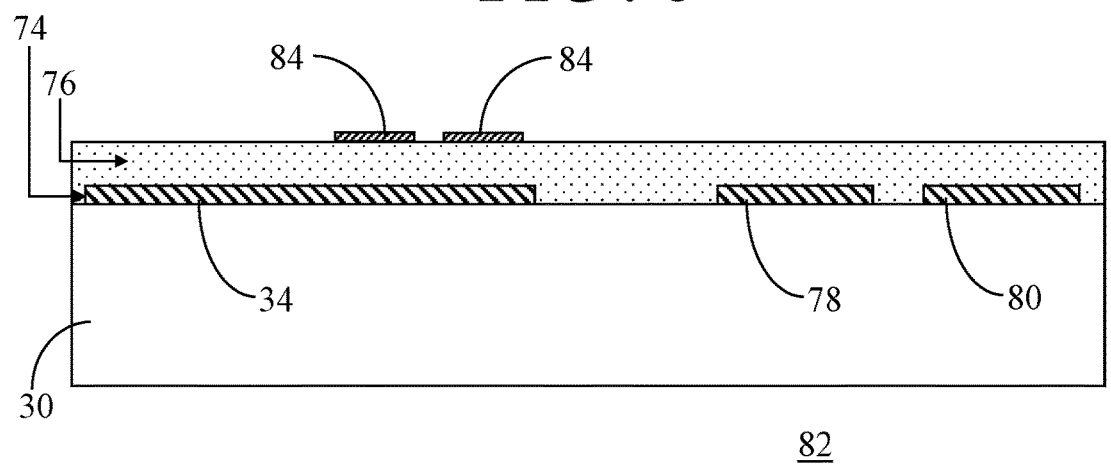
FIG. 6 shows a side sectional view of the structure of FIG. 5 at a subsequent stage of processing.

FIG. 6 shows a side sectional view of the structure of FIG. 5 at a subsequent stage 82 of processing. At subsequent stage 82, magnetic sense element 24 has been formed over electrically insulating layer 76 of active silicon substrate 30 in accordance with block 58 of fabrication process 50. In this example, AMR material such as a nickel-iron (Ni—Fe) is deposited over electrically insulating layer 76, photoresist may be deposited and structured, the Ni—Fe material is suitably patterned, and thereafter the photoresist is stripped. Accordingly, NiFe stripes 84 of AMR-based magnetic sense element 24 remain on electrically insulating layer 76. Only two NiFe stripes 84 are shown for simplicity. Those skilled in the art will recognize that AMR-based magnetic sense element 24 may include a multiplicity of NiFe stripes 84. Further, materials, other ferromagnetic materials exhibiting the AMR effect may alternatively be used.

Figure 7:
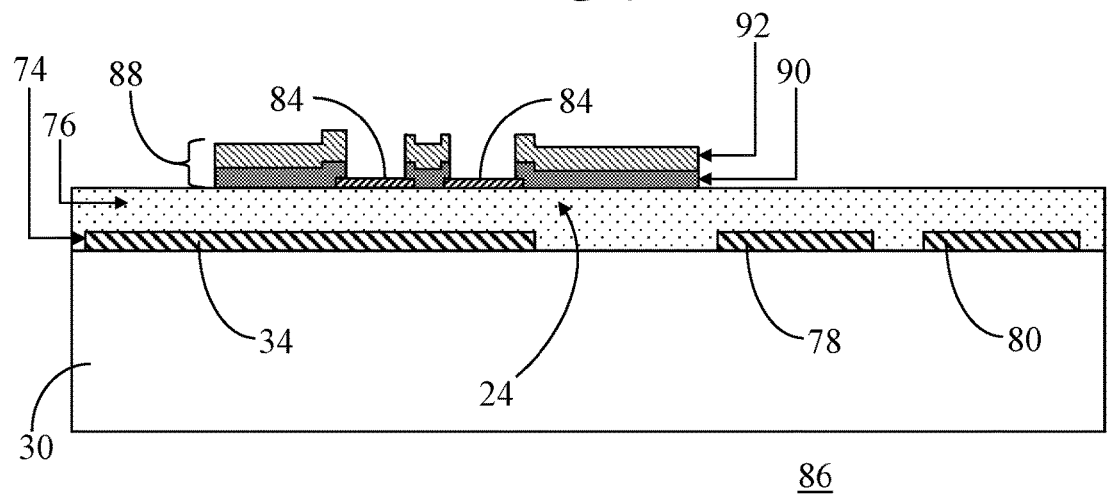
FIG. 7 shows a side sectional view of the structure of FIG. 6 at a subsequent stage of processing.

FIG. 7 shows a side sectional view of the structure of FIG. 6 at a subsequent stage 86 of processing. At subsequent stage 86, a local interconnect layer 88 of magnetic sense element 24 has been formed over electrically insulating layer 76 of active silicon substrate 30 in accordance with block 58 of fabrication process 50. By way of example, a barrier layer 90 may be deposited over insulating layer 76, and at least a portion of NiFe stripes 84. A metal layer 92 for local interconnect layer 88 may be deposited over barrier layer 90. Barrier layer 90 may be, for example, tungsten-titanium (WTi) that is generally suitable as a diffusion barrier and adhesion layer during a metallization process in which metal layer 92 is formed. Metal layer 92 may be, for example, aluminum and/or copper and barrier layer 90 separates NiFe stripes 84 from the metallization layers. Thereafter, a photoresist may be deposited over metal layer 92 and suitably structured, metal layer 92 is wet or dry etched, the photoresist is stripped, and barrier layer 90 is etched, using metal layer 92 as a hardmask, to yield local interconnect layer 88 between NiFe stripes 84.

Figure 8:
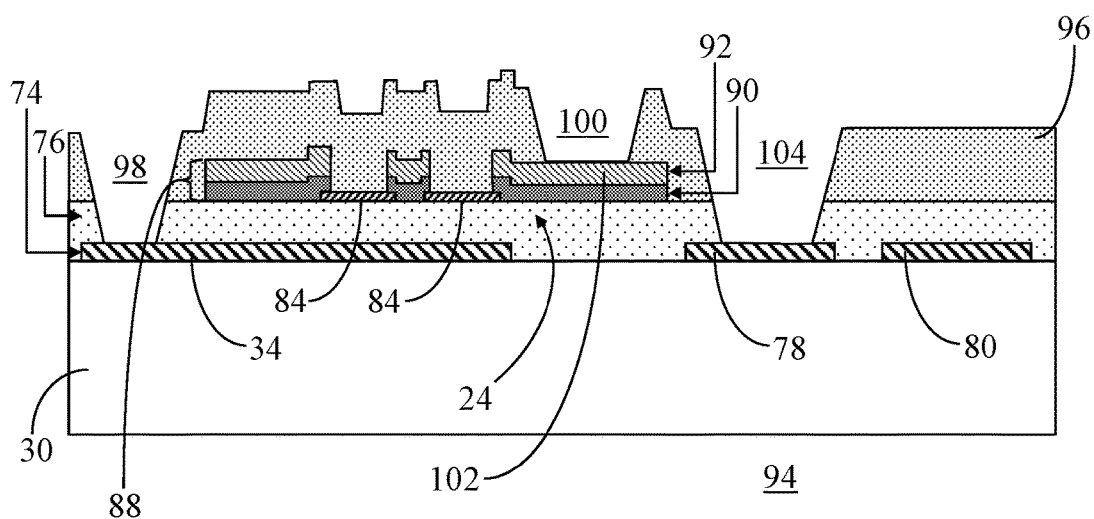
FIG. 8 shows a side sectional view of the structure of FIG. 7 at a subsequent stage of processing.

FIG. 8 shows a side sectional view of the structure of FIG. 7 at a subsequent stage 94 of processing. At subsequent stage 94, a passivation layer 96 (alternatively referred to as a first protective layer 96) has been formed over NiFe stripes 84 and local interconnect layer 88 of magnetic sense element 24 in accordance with block 60 of fabrication process 50. Additionally, first openings 98 are formed extending through protective layer 96 and insulating layer 76 to first coil segments 34. Second openings 100 are formed extending through protective layer 96 to one or more contact pads 102 (one shown) of magnetic sense element 24. Third openings 104 are formed extending through protective layer 96 to one or more sensor contact pads 78 in top metal layer 74 of active silicon substrate 30. First, second, and third openings 98, 100, 104 may be formed by any suitable wet or dry etching process.

Figure 9:
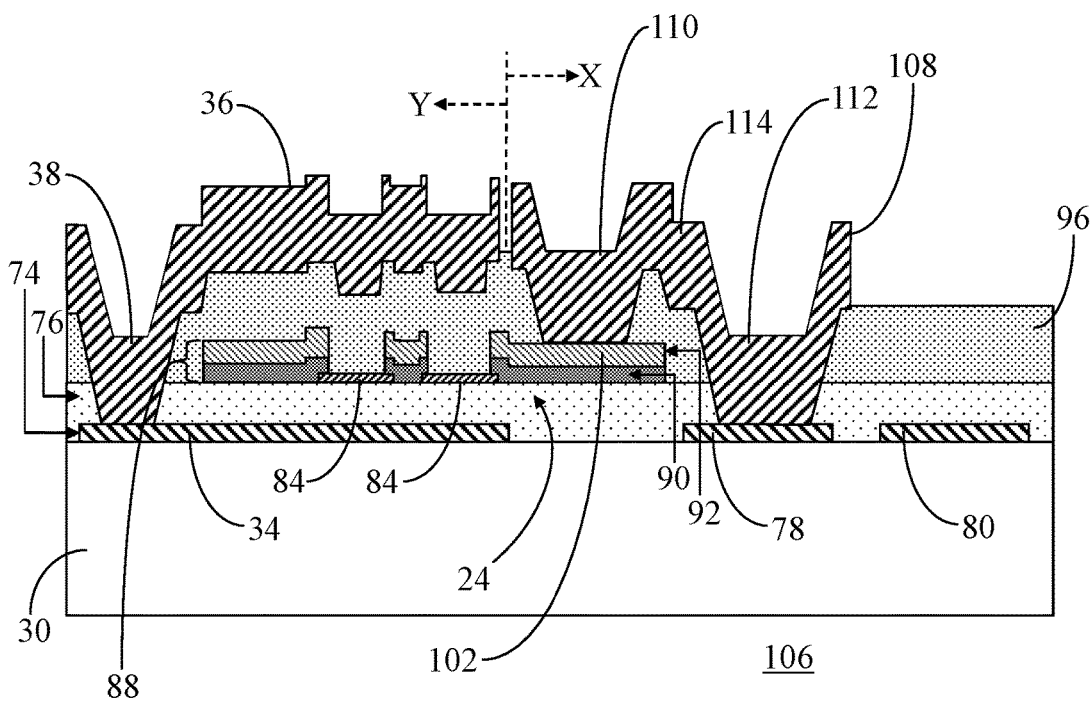
FIG. 9 shows a side sectional view of the structure of FIG. 8 at a subsequent stage of processing.

FIG. 9 shows a side sectional view of the structure of FIG. 8 at a subsequent stage 106 of processing. At subsequent stage 106, a final metal layer 108 (alternatively referred to as a second electrically conductive layer 108) is utilized to fill openings 98, 100, 104 and thereby form first electrically conductive vias 38 electrically coupled with first coil segments 34, second electrically conductive vias 110 (one shown) electrically coupled with contact pad 102 of magnetic sense element 24, and third electrically conductive vias 112 electrically coupled with contact pads 78 in accordance with block 62 of fabrication process 50. Additionally, final metal layer 108 may be used to form conductive traces 114 (one shown) electrically interconnecting second and third conductive vias 110, 112 in accordance with block 64 of fabrication process 50 and to form second coil segments 36 in accordance with block 66 of fabrication process 50. First vias 38, second vias 110, third vias 112, second coil segments 36, and conductive trace 114 may be formed concurrently, and final metal layer 108 need not be planar. The X and Y axes of a 3-dimensional coordinate system are shown in FIG. 9 to demonstrate that the cross section may be in two directions. The same holds true for FIGS. 8-15.

Figure 10:
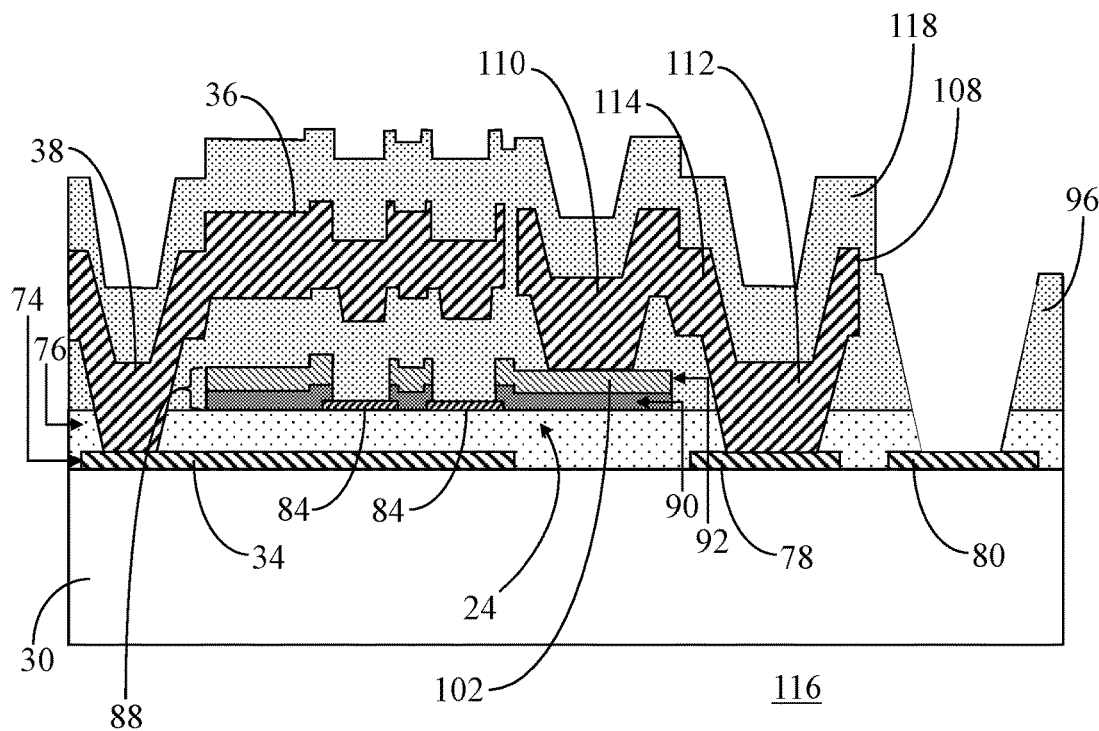
FIG. 10 shows a side sectional view of the structure of FIG. 9 at a subsequent stage of processing.

FIG. 10 shows a side sectional view of the structure of FIG. 9 at a subsequent stage 116 of processing. At subsequent stage 116, another protective layer 118 (alternatively referred to as a second protective layer 118) is formed over first, second, and third vias 38, 110, 112, second coil segments 36, and conductive traces 114 in accordance with block 68 of fabrication process 50. Additionally, protective layer 118, protective layer 96, and insulating layer 76 may be suitably wet or dry etched to expose or otherwise open bond pads 80.

Figure 11:
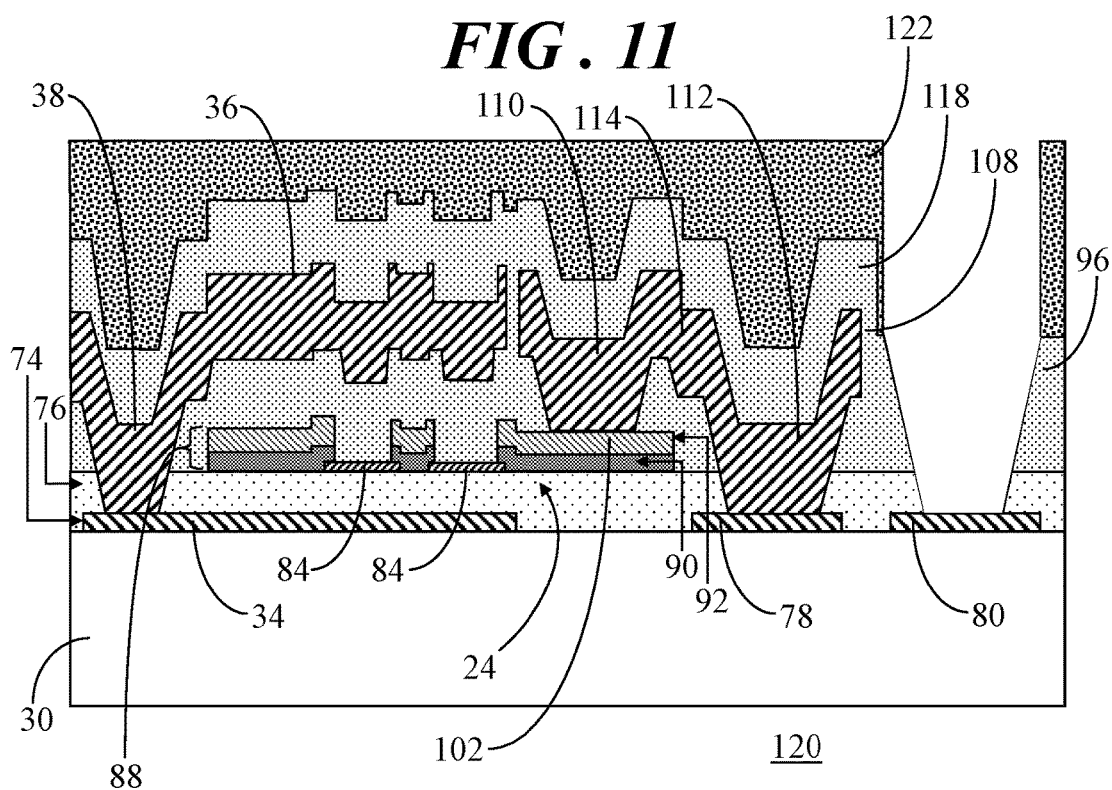
FIG. 11 shows a side sectional view of the structure of FIG. 10 at a subsequent stage of processing.

FIG. 11 shows a side sectional view of the structure of FIG. 10 at a subsequent stage 120 of processing. At subsequent stage 120, a wafer coating process was performed to deposit an insulating material 122 over the entire surface of the structure (e.g., over the protective passivation layer 118) to yield a wafer-level chip package having a generally uniform surface.

Figure 12:
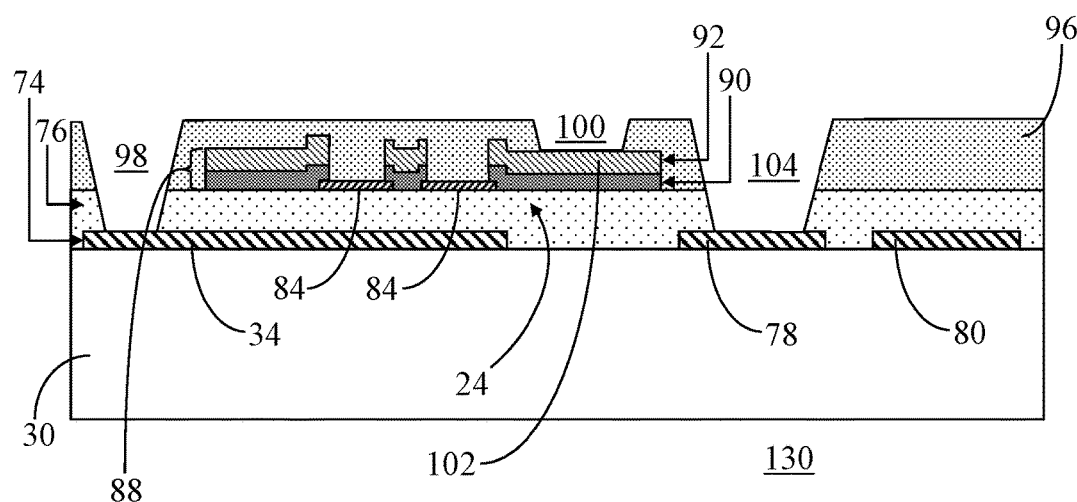
FIG. 12 shows a side sectional view of the structure of FIG. 8 at a subsequent stage of processing in accordance with another embodiment.

With continued reference to magnetic field sensor fabrication process 50 of FIG. 4 and referring now to FIG. 12, FIG. 12 shows a side sectional view of the structure of FIG. 8 at a subsequent stage 130 of processing in accordance with another embodiment. In this example, following deposition of protective layer 96 at block 60 of fabrication process 50, protective layer 96 may undergo chemical-mechanical planarization (CMP). Such a process may be useful to reduce (i.e., flatten) the topography and enable a minimum spacing between coil windings in order to increase coil efficiency.

Figure 13:
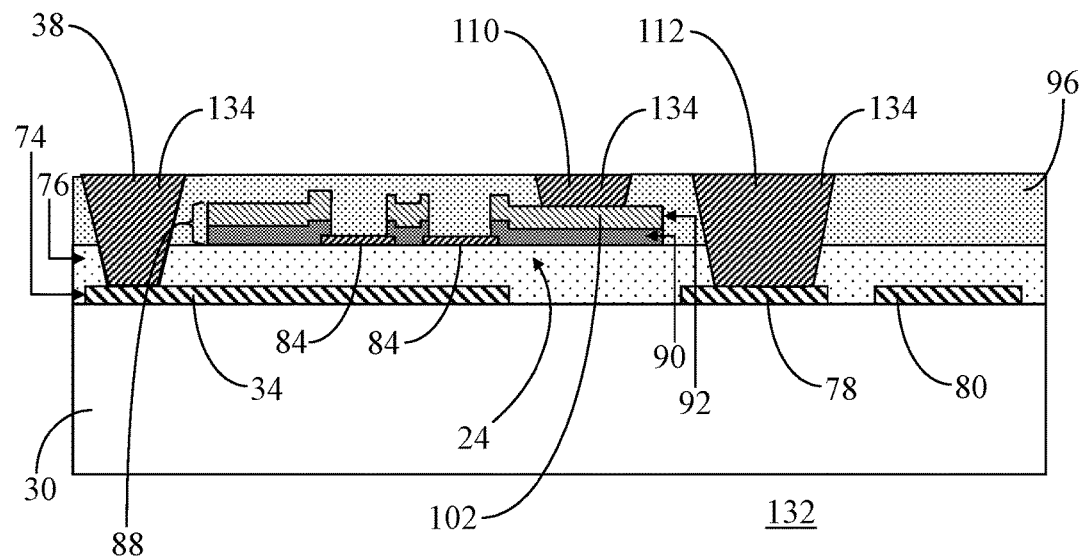
FIG. 13 shows a side sectional view of the structure of FIG. 12 at a subsequent stage of processing.

FIG. 13 shows a side sectional view of the structure of FIG. 12 at a subsequent stage 132 of processing. At subsequent stage 132, openings 98, 100, 104 (FIG. 12) have been filled with an electrically conductive material 134 (e.g., tungsten) which may be planarized to form first, second, and third conductive vias 38, 110, 112 in accordance with block 62 of fabrication process 50.

Figure 14:
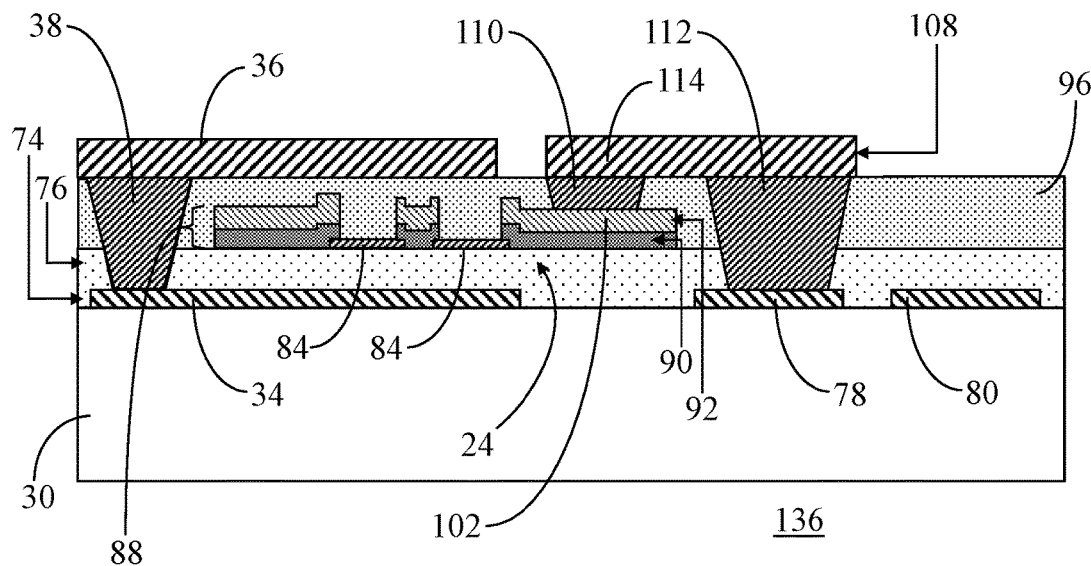
FIG. 14 shows a side sectional view of the structure of FIG. 13 at a subsequent stage of processing.

FIG. 14 shows a side sectional view of the structure of FIG. 13 at a subsequent stage 136 of processing. At subsequent stage 136, final metal layer 108 has been deposited, patterned, and suitably wet or dry etched to form conductive traces 114 electrically interconnecting second and third conductive vias 110, 112 in accordance with block 64 of fabrication process 50 and to form second coil segments 36 in accordance with block 66 of fabrication process 50.

Figure 15:
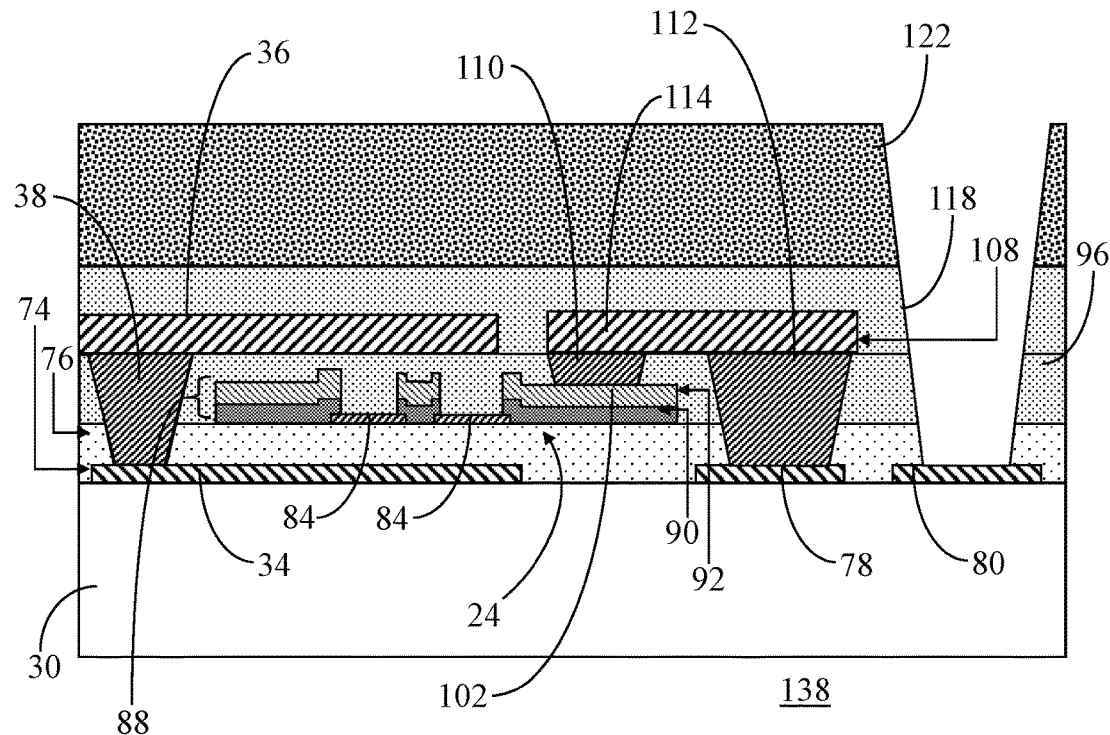
FIG. 15 shows a side sectional view of the structure of FIG. 14 at a subsequent stage of processing.

FIG. 15 shows a side sectional view of the structure of FIG. 14 at a subsequent stage 138 of processing. At subsequent stage 138, second protective layer 118 has been deposited over final metal layer 108 in accordance with block 68 of fabrication process 50. Additionally, the structure has undergone a wafer coating process to deposit insulating material 122 over the structure in accordance with block 70 of fabrication process 50. Additionally, insulating material 122, protective layer 118, protective layer 96, and insulating layer 76 have been suitably wet or dry etched to expose or otherwise open bond pads 80.

Figure 16:
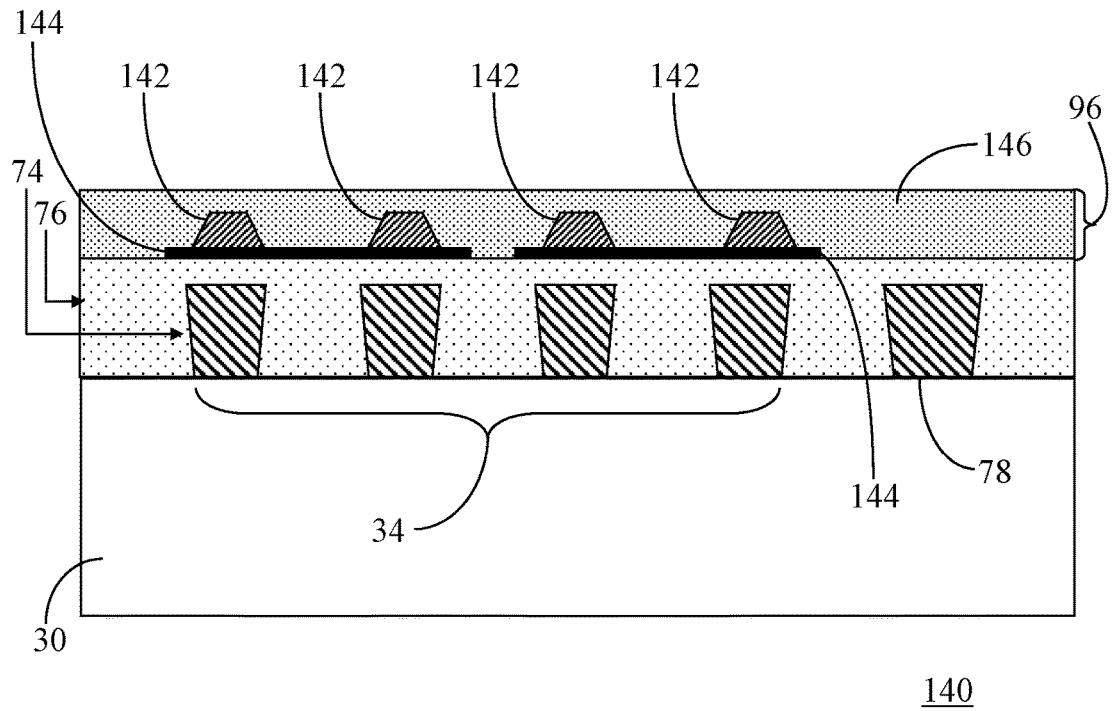
FIG. 16 shows a simplified side sectional view of another structure at an initial stage of processing in accordance with an embodiment.

With continued reference to magnetic field sensor fabrication process 50 of FIG. 4 and referring now to FIG. 16, FIG. 16 shows a simplified side sectional view of another structure at an initial stage 140 of processing in accordance with another embodiment. In this example, the operations of magnetic field sensor fabrication process 50 are demonstrated for a TMR-based magnetic field sensor configuration. At initial stage 140, active silicon substrate 30 has been provided in accordance with block 52 of fabrication process 50, first coil segments 34 and second contact pad 78 are formed in first electrically conductive layer 74 in accordance with block 54 of fabrication process 50, and insulating layer 76 of active silicon substrate 30 is deposited over the structures of first electrically conductive layer 74. In addition, magnetic sense elements, referred to herein as TMR-based magnetic sense elements 142, are formed in accordance with block 58 of fabrication process 50.

Fabrication of TMR-based magnetic sense elements 142 entails forming first electrodes 144 and TMR-based magnetic sense elements 142 (i.e., TMR stack structures) over insulating layer 76. In accordance with known processes and a particular design configuration, TMR-based magnetic sense elements 142 are selectively electrically coupled with first electrodes 144. Thereafter, a first portion 146 of protective layer 96 may be deposited over TMR-based magnetic sense elements 142 in accordance with block 60 of fabrication process 50.

Figure 17:
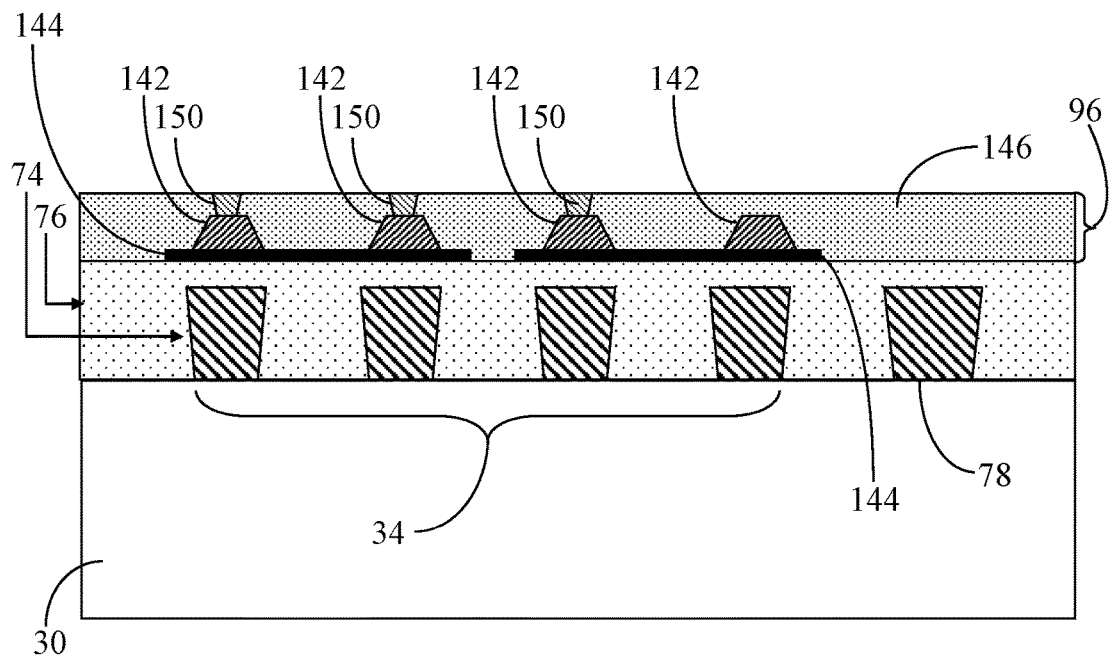
FIG. 17 shows a side sectional view of the structure of FIG. 16 at a subsequent stage of processing.

FIG. 17 shows a side sectional view of the structure of FIG. 16 at a subsequent stage 148 of processing. At subsequent stage 148, electrically conductive plugs 150 (e.g., copper, tungsten, and the like) have been formed extending through first portion 146 of protective layer 96 to electrically interconnect with TMR-based magnetic sense elements 142 in accordance with block 59 of fabrication process 50.

Figure 18:
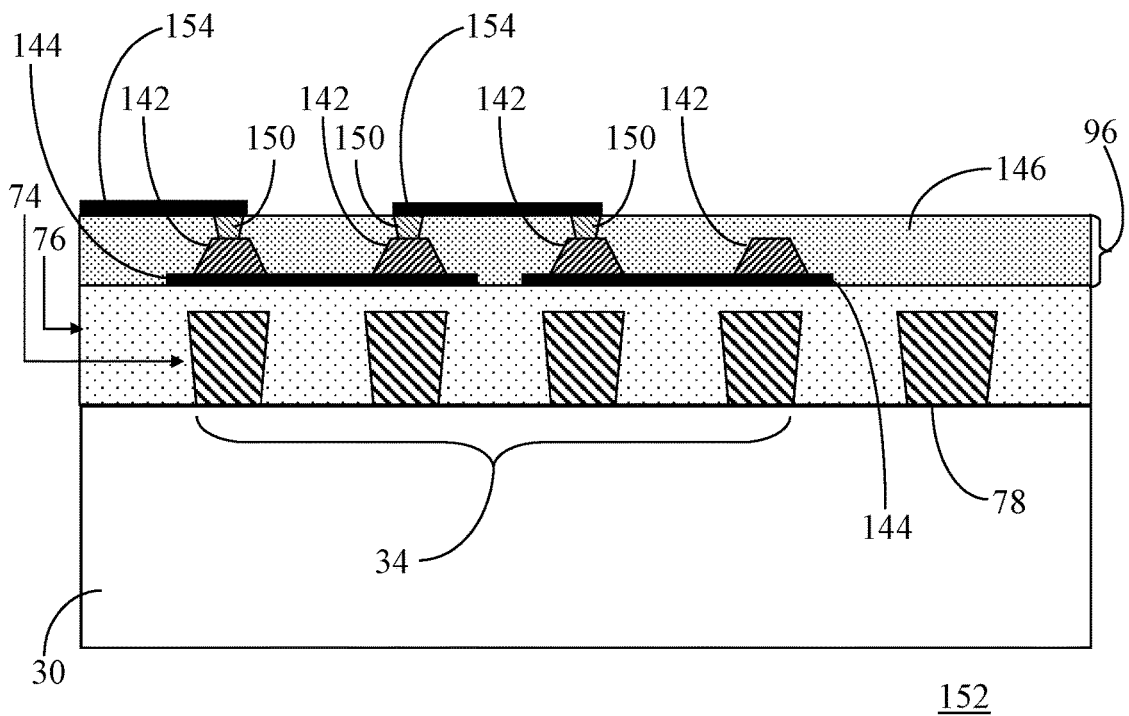
FIG. 18 shows a side sectional view of the structure of FIG. 17 at a subsequent stage of processing.

FIG. 18 shows a side sectional view of the structure of FIG. 17 at a subsequent stage 152 of processing. At subsequent stage 152, second electrodes 154 are formed over TMR-based magnetic sense elements 142 in accordance with block 59 of fabrication process 50. In accordance with known processes and a particular design configuration, second electrodes 154 are selectively electrically coupled with TMR-based magnetic sense elements 142.

Figure 19:
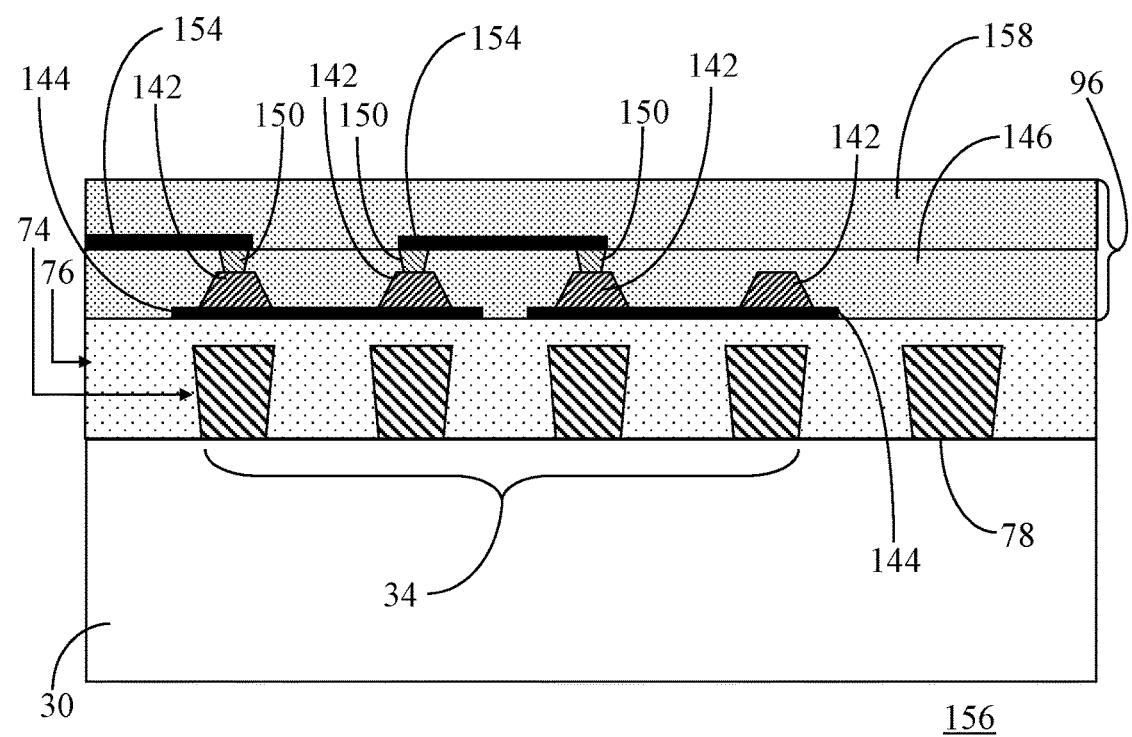
FIG. 19 shows a side sectional view of the structure of FIG. 18 at a subsequent stage of processing.

FIG. 19 shows a side sectional view of the structure of FIG. 18 at a subsequent stage 156 of processing. At subsequent stage 156, a second portion 158 of protective layer 96 may be formed over second electrodes 154 in accordance with block 60 of fabrication process 50. Thus, as mentioned above, the particular ordering of the process blocks depicted in FIG. 4 may be modified, while achieving substantially the same result, and certain ones of the process blocks may be performed in parallel as demonstrated in connection with FIGS. 16-19.

Figure 20:
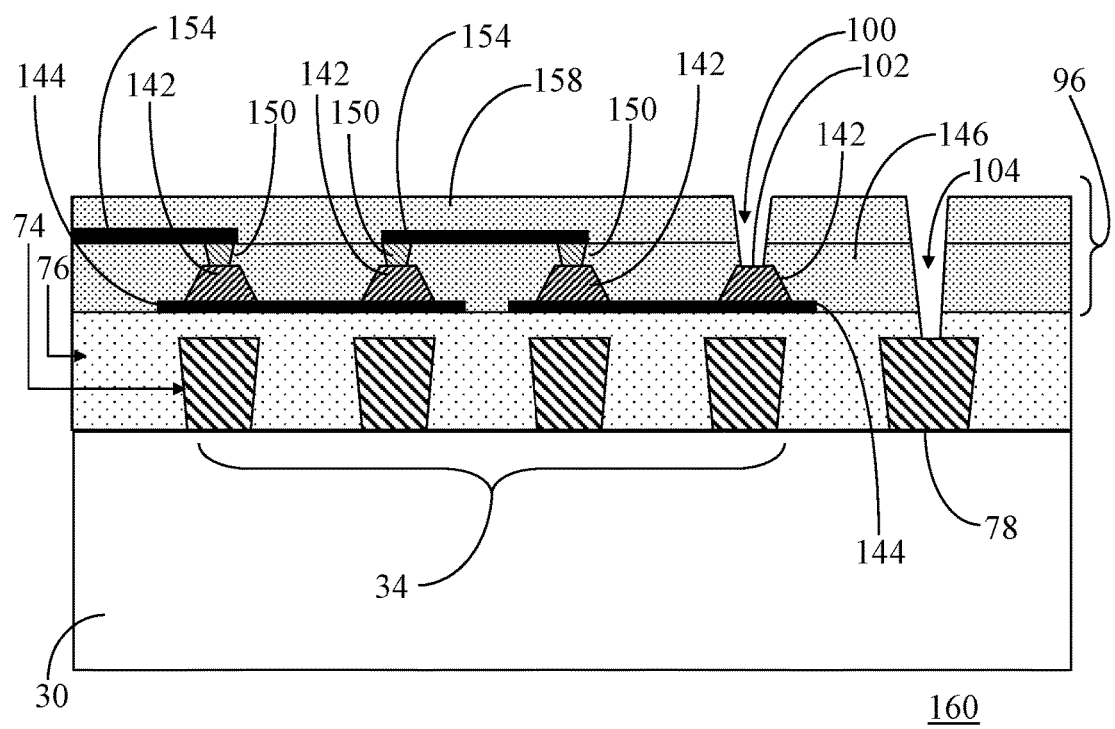
FIG. 20 shows a side sectional view of the structure of FIG. 19 at a subsequent stage of processing.

FIG. 20 shows a side sectional view of the structure of FIG. 19 at a subsequent stage 160 of processing. At subsequent stage 160, first openings 98 are formed extending through protective layer 96 and insulating layer 76 to first coil segments 34. First openings 98 are not visible in FIG. 20, but are used to form first conductive vias 38 shown in FIG. 23 below. Second openings 100 are formed extending protective layer 96 to one or more contact pads 102 (one shown) of TMR-based magnetic sense elements 142. Third openings 104 are formed extending through protective layer 96 to one or more sensor contact pads 78 in top metal layer 74 of active silicon substrate 30. First, second, and third openings 98, 100, 104 may be formed by any suitable etching process.

Figure 21:
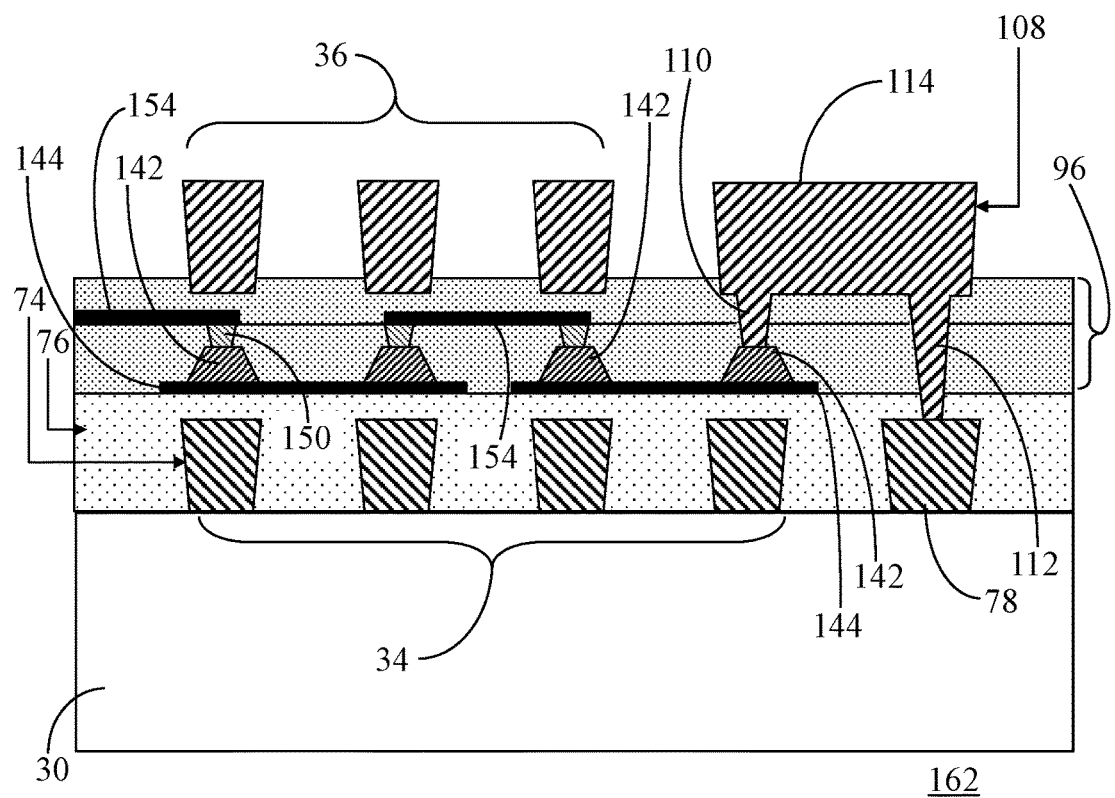
FIG. 21 shows a side sectional view of the structure of FIG. 20 at a subsequent stage of processing.

FIG. 21 shows a side sectional view of the structure of FIG. 20 at a subsequent stage 162 of processing. At subsequent stage 162, a final metal layer 108 (alternatively referred to as a second electrically conductive layer 108) is utilized to fill openings 98, 100, 104 and thereby form first electrically conductive vias 38 (shown in FIG. 23) electrically coupled with first coil segments 34, second electrically conductive vias 110 (one shown) electrically coupled with contact pad 102 of magnetic sense element 24, and third electrically conductive vias 112 electrically coupled with contact pads 78 in accordance with block 62 of fabrication process 50. Additionally, final metal layer 108 may be used to form conductive traces 114 (one shown) electrically interconnecting second and third conductive vias 110, 112 in accordance with block 64 of fabrication process 50 and to form second coil segments 36 in accordance with block 66 of fabrication process 50. First vias 38, second vias 110, third vias 112, second coil segments 36, and conductive trace 114 may be formed concurrently, and final metal layer 108 may or may not undergo CMP.

Figure 22:
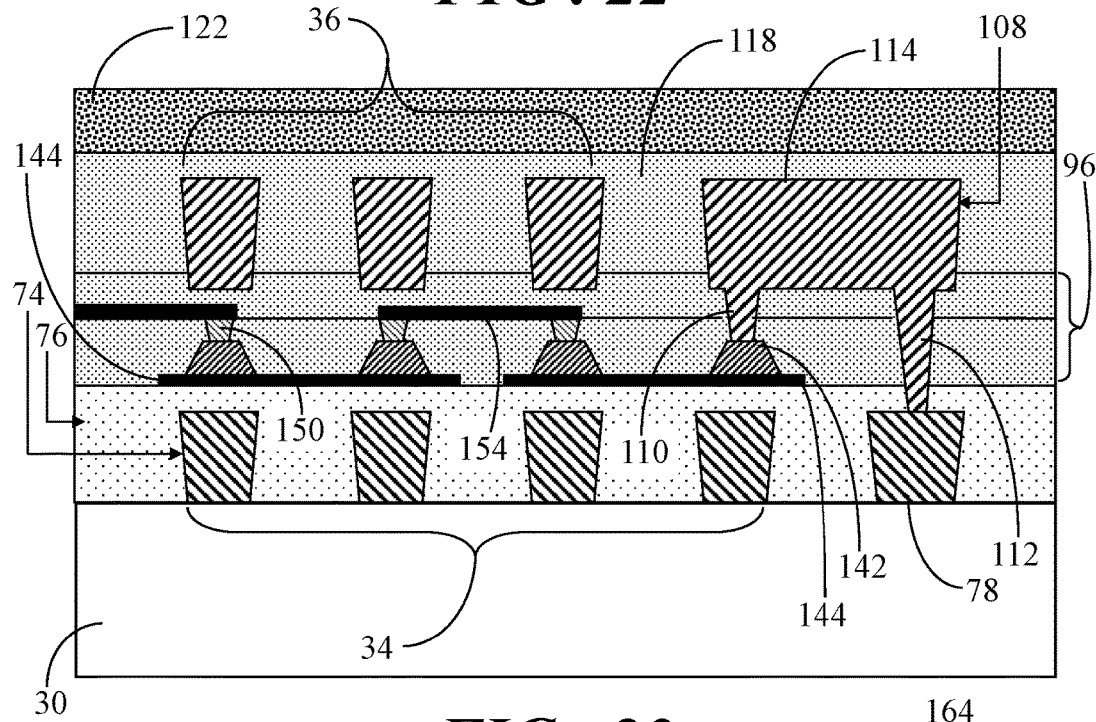
FIG. 22 shows a side sectional view of the structure of FIG. 21 at a subsequent stage of processing.
Figure 23:
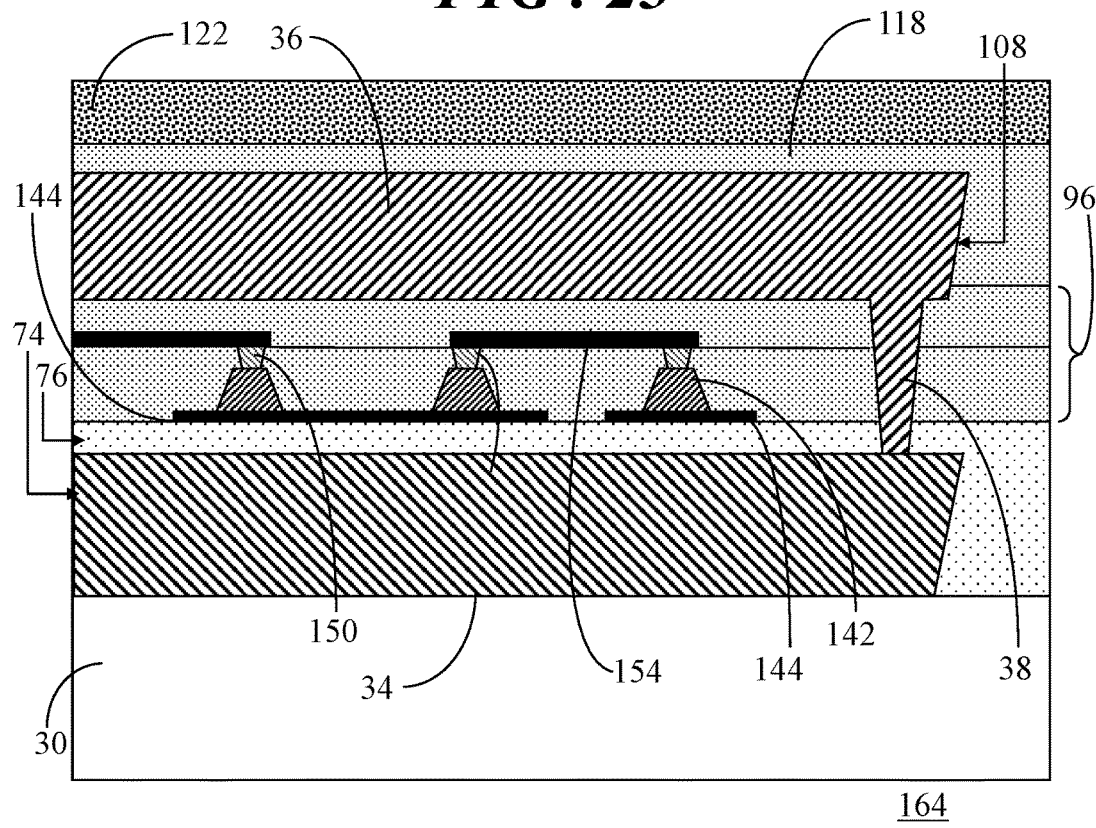
FIG. 23 shows a side sectional view of the structure of FIG. 22 at a subsequent stage of processing.

Referring collectively to FIGS. 22-23, FIG. 22 shows a side sectional view of the structure of FIG. 21 at a subsequent stage 164 of processing. Similarly, FIG. 23 shows another side sectional view of the structure of FIG. 22 at subsequent stage 164 of processing. In FIG. 23, the structure of FIG. 22 is rotated approximately ninety degrees so that one of first conductive vias 38 is visible. At subsequent stage 164, second protective layer 118 is formed over first, second, and third conductive vias 38, 110, 112, second coil segments 36, and conductive traces 114 in accordance with block 68 of fabrication process 50. Additionally, a wafer coating process was performed to deposit insulating material 122 over the entire surface of the structure (e.g., over the protective passivation layer 118) to yield a wafer-level chip package having a generally uniform surface. Further as discussed above in connection with FIGS. 10 and 11, protective layers 96, 118, and insulating layer 76 may be suitably wet or dry etched to expose or otherwise open the bond pads (not shown).

Embodiments described herein entail magnetic field sensors and methodology for fabricating magnetic field sensors. An embodiment of a method comprises forming first coil segments in an electrically conductive layer of an active silicon substrate, forming a magnetic sense element over an electrically insulating layer of the active silicon substrate, the magnetic sense element being separated from the first coil segments in the electrically conductive layer by the electrically insulating layer, and forming a protective layer over the magnetic sense element. The method further comprises forming conductive vias extending through the protective layer and the electrically insulating layer to electrically couple with the first coil segments, and forming second coil segments over the protective layer, the second coil segments electrically coupling with the conductive vias to produce a coil structure of the first coil segments, the conductive vias, and the second coil segments, and the coil structure surrounding the magnetic sense element.

An embodiment of a magnetic field sensor comprises an active silicon substrate having a processing circuit formed therein, the active silicon substrate having an electrically conductive layer and an electrically insulating layer overlying the electrically conductive layer, a magnetic sense element formed over the electrically insulating layer of the active silicon substrate, and a coil structure surrounding the magnetic sense element. The coil structure comprises first coil segments formed in the electrically conductive layer of the active silicon substrate such that the magnetic sense element is separated from the first coil segments by the electrically insulating layer, conductive vias extending through a protective layer overlying the magnetic sense element, the conductive vias being electrically coupled with the first coil segments, and second coil segments formed over the protective layer, the second coil segments being electrically coupled with the conductive vias to produce the coil structure.

Another embodiment of a method comprises forming first coil segments in an electrically conductive layer of an active silicon substrate, forming a magnetic sense element over an electrically insulating layer of the active silicon substrate, the magnetic sense element being separated from the first coil segments in the electrically conductive layer by the electrically insulating layer, forming a protective layer over the magnetic sense element, forming first conductive vias extending through the protective layer and the electrically insulating layer to electrically couple with the first coil segments, and forming a second conductive via extending through the protective layer to electrically couple with a contact pad of the magnetic sense element. The method further comprises forming a third conductive via extending through the protective layer and the electrically insulating layer to electrically couple with an electrical contact in the electrically conductive layer of the active silicon substrate, wherein the electrical contact is electrically coupled to a processing circuit in the active silicon substrate, and forming second coil segments over the protective layer, the second coil segments electrically coupling with the first conductive vias to produce a coil structure of the first coil segments, the first conductive vias, and the second coil segments, and the coil structure surrounding the magnetic sense element.

The fabrication methodology yields a magnetic field sensor having one or more magnetic sense elements encompassed by a three-dimensional coil structure. The magnetic sense elements and coil structure may be formed on an active silicon substrate that contains an integrated circuit for sensor signal processing and control circuitry for the coil structure. Such a three-dimensional coil structure may replace commonly used and costly bias magnets for speed sensing with the benefit of improved linearity and temperature behavior. Further, a three-dimensional coil structure may enable superior applied magnetic field strength to power consumption ratio as compared to a planar coil structure. Thus, on-chip signal modulation techniques, bias field flipping, feedback compensation, and magnetic sense element self-test may be feasible. The fabrication methodology may achieve a robust, cost optimized, and high yield process that enables relatively low cost integration of the integrated circuit, the magnetic field sensor, and the three-dimensional coil structure. In particular, using the top metal layer of the active silicon substrate to form the first coil segments of the coil structure can lead to cost and manufacturing time reductions. Further, a variety of three-dimensional coil structure designs may be envisioned that may achieve further savings in the form of relatively low area consumption.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
    forming first coil segments in an electrically conductive layer of an active silicon substrate;
    forming a magnetic sense element over an electrically insulating layer of the active silicon substrate, the magnetic sense element being separated from the first coil segments in the electrically conductive layer by the electrically insulating layer;
    forming a protective layer over the magnetic sense element;
    forming conductive vias extending through the protective layer and the electrically insulating layer to electrically couple with the first coil segments; and
    forming second coil segments over the protective layer, the second coil segments electrically coupling with the conductive vias to produce a coil structure of the first coil segments, the conductive vias, and the second coil segments, and the coil structure surrounding the magnetic sense element.

2. The method of claim 1 wherein the conductive vias are first conductive vias, and the method further comprises forming a second conductive via extending through the protective layer to electrically couple with a contact pad of the magnetic sense element.

3. The method of claim 2 wherein forming the second conductive via occurs concurrently with forming the first conductive vias.

4. The method of claim 2 further comprising forming a third conductive via extending through the protective layer and the electrically insulating layer to electrically couple with an electrical contact in the electrically conductive layer of the active silicon substrate, wherein the electrical contact is electrically coupled to a processing circuit in the active silicon substrate.

5. The method of claim 4 further comprising utilizing a second electrically conductive layer to form the first, second, and third conductive vias concurrently with the second coil segments and to form a conductive trace that electrically interconnects the second and third conductive vias.

6. The method of claim 4 further comprising forming a second protective layer over the second coil segments, the first conductive via, and the conductive trace that electrically interconnects the second and third conductive vias.

7. The method of claim 4 further comprising planarizing the protective layer prior to forming the first, second, and third conductive vias.

8. The method of claim 7 further comprising:
    depositing an electrically conductive layer over the first, second, and third conductive vias and the protective layer; and
    following formation of the first, second, and third conductive vias, forming a conductive trace in the electrically conductive layer that electrically interconnects the second and third conductive vias, wherein the second coil segments are additionally formed in the electrically conductive layer concurrently with formation of the conductive trace.

9. The method of claim 1 wherein forming the magnetic sense element comprises:
    forming first electrodes over the electrically insulating layer;
    forming a plurality of magnetic sense elements over the first electrodes, wherein the magnetic sense element is one of the plurality of magnetic sense elements, and the plurality of magnetic sense elements are selectively electrically coupled with the first electrodes; and
    forming second electrodes over the plurality of magnetic sense elements, wherein the second electrodes are selectively electrically coupled with the magnetic sense elements, and wherein the protective layer is deposited over the second electrodes and the plurality of magnetic sense elements.

10. The method of claim 1 wherein the magnetic sense element comprises at least one of an anisotropic magnetoresistance (AMR) sensor or a tunnel magnetoresistance (TMR) sensor.

11. A magnetic field sensor comprising:
    an active silicon substrate having a processing circuit formed therein, the active silicon substrate having an electrically conductive layer and an electrically insulating layer overlying the electrically conductive layer;
    a magnetic sense element formed over the electrically insulating layer of the active silicon substrate; and
    a coil structure surrounding the magnetic sense element comprising:
        first coil segments formed in the electrically conductive layer of the active silicon substrate such that the magnetic sense element is separated from the first coil segments by the electrically insulating layer;
        conductive vias extending through a protective layer overlying the magnetic sense element, the conductive vias being electrically coupled with the first coil segments; and
        second coil segments formed over the protective layer, the second coil segments being electrically coupled with the conductive vias to produce the coil structure.

12. The magnetic field sensor of claim 11 wherein the conductive vias are first conductive vias, and the magnetic field sensor further comprises a second conductive via extending through the protective layer to electrically couple with a contact pad of the magnetic sense element.

13. The magnetic field sensor of claim 12 further comprising a third conductive via extending through the protective layer and the electrically insulating layer, the third conductive via electrically coupling with an electrical contact in the electrically conductive layer of the active silicon substrate, wherein the electrical contact is electrically coupled to a processing circuit in the active silicon substrate.

14. The magnetic field sensor of claim 13 wherein the first, second, and third conductive vias are formed in a second electrically conductive layer, and the magnetic field sensor further comprises a conductive trace formed in the second electrically conductive layer and electrically interconnecting the second and third conductive vias.

15. The magnetic field sensor of claim 11 further comprising:

a plurality of magnetic sense elements, the magnetic sense element being one of the plurality of magnetic sense elements;

first electrodes formed over the electrically insulating layer and underlying the plurality of magnetic sense elements, the plurality of magnetic sense elements being selectively electrically coupled with the first electrodes; and second electrodes formed over the plurality of magnetic sense elements, the second electrodes being selectively electrically coupled with the magnetic sense elements, and the protective layer being deposited over the second electrodes and the plurality of magnetic sense elements.

16. The magnetic field sensor of claim 11 wherein the magnetic sense element comprises at least one of an anisotropic magnetoresistance (AMR) sensor or a tunnel magnetoresistance (TMR) sensor.

17. A method comprising:

forming first coil segments in an electrically conductive layer of an active silicon substrate;

forming a magnetic sense element over an electrically insulating layer of the active silicon substrate, the magnetic sense element being separated from the first coil segments in the electrically conductive layer by the electrically insulating layer;

forming a protective layer over the magnetic sense element;

forming first conductive vias extending through the protective layer and the electrically insulating layer to electrically couple with the first coil segments;

forming a second conductive via extending through the protective layer to electrically couple with a contact pad of the magnetic sense element;

forming a third conductive via extending through the protective layer and the electrically insulating layer to electrically couple with an electrical contact in the electrically conductive layer of the active silicon substrate, wherein the electrical contact is electrically coupled to a processing circuit in the active silicon substrate; and forming second coil segments over the protective layer, the second coil segments electrically coupling with the first conductive vias to produce a coil structure of the first coil segments, the first conductive vias, and the second coil segments, and the coil structure surrounding the magnetic sense element.

18. The method of claim 17 further comprising utilizing a second electrically conductive layer to form the first, second, and third conductive vias concurrently with the second coil segments and to form a conductive trace that electrically interconnects the second and third conductive vias.

19. The method of claim 17 further comprising:

planarizing the protective layer prior to forming the first, second, and third conductive vias;

following formation of the first, second, and third conductive vias, depositing an electrically conductive layer over the first, second, and third conductive vias and the protective layer; and forming a conductive trace in the electrically conductive layer that electrically interconnects the second and third conductive vias, wherein the second coil segments are additionally formed in the electrically conductive layer concurrently with formation of the conductive trace.

20. The method of claim 17 wherein forming the magnetic sense element comprises:

forming first electrodes over the electrically insulating layer; and forming a plurality of magnetic sense elements over the first electrodes, wherein the magnetic sense element is one of the plurality of magnetic sense elements, and the plurality of magnetic sense elements are selectively electrically coupled with the first electrodes; and forming second electrodes over the plurality of magnetic sense elements, wherein the second electrodes are selectively electrically coupled with the magnetic sense elements, and wherein the protective layer is deposited over the second electrodes and the plurality of magnetic sense elements.

* * * * *